US012632630B2

(12) United States Patent
Chai

(10) Patent No.: US 12,632,630 B2
(45) Date of Patent: May 19, 2026

(54) SEMICONDUCTOR EQUIPMENT MODELING METHOD AND DEVICE

(71) Applicant: BEIJING NAURA MICROELECTRONICS EQUIPMENT CO., LTD., Beijing (CN)

(72) Inventor: Jiajia Chai, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 794 days.

(21) Appl. No.: 18/041,120

(22) PCT Filed: Jul. 6, 2021

(86) PCT No.: PCT/CN2021/104679
§ 371 (c)(1),
(2) Date: Feb. 9, 2023

(87) PCT Pub. No.: WO2022/012371
PCT Pub. Date: Jan. 20, 2022

(65) Prior Publication Data
US 2023/0267255 A1 Aug. 24, 2023

(30) Foreign Application Priority Data
Jul. 15, 2020 (CN) .......................... 202010683246.9

(51) Int. Cl.
*G06F 30/3323* (2020.01)
*G06F 30/367* (2020.01)

(52) U.S. Cl.
CPC ........ *G06F 30/3323* (2020.01); *G06F 30/367* (2020.01)

(58) Field of Classification Search
CPC ........................... G06F 30/3323; G06F 30/367
(Continued)

(56) References Cited

U.S. PATENT DOCUMENTS 6,978,259 B1 12/2005 Anderson et al.
7,363,610 B2 * 4/2008 Alfieri ..................... G06F 30/30
716/108
(Continued)

FOREIGN PATENT DOCUMENTS

CN 107766042 A 3/2018
CN 107799042 A 3/2018
(Continued)

OTHER PUBLICATIONS

The World Intellectual Property Organization (WIPO) International Search Report for PCT/CN2021/104679 Sep. 28, 2021 6 Pages (including translation).

*Primary Examiner* — Suresh Memula
(74) *Attorney, Agent, or Firm* — Anova Law Group, PLLC

(57) ABSTRACT

Embodiments of the present disclosure provide a semiconductor equipment modeling method. The method includes, in response to an adding instruction operation, determining a type of a source controller configured to display an equipment model object and a type of a target controller configured to display an equipment model tree, using a verification module corresponding to the type of the source controller and the type of the target controller to obtain information of the selected to-be-added model and information of the selected target model, performing verification on the information of the to-be-added model and the information of the target model based on a predetermined equipment modeling type verification criterion library to determine whether the to-be-added model is able to be used as a sub-node of the target model, and displaying a verification
(Continued)

101
In response to an adding instruction operation of, determine a type of a source controller configured to display an equipment model object and a type of a target controller configured to display an apparatus model tree 102
Obtain the information of the selected to-be-added model and the information of the selected target model, verify the information of the to-be-added model and the information of the target model based on a predetermined apparatus modeling type verification criterion library and determine whether the to-be-added model can be used as a sub-node of the target model in the equipment model tree 103
Display a verification result indicating whether the to-be-added model can be used as the sub-node of the target model in the equipment model tree result indicating whether the to-be-added model is able to be used as the sub-node of the target model.

10 Claims, 5 Drawing Sheets

(58) Field of Classification Search
USPC ........................................................ 716/106
See application file for complete search history.

(56) References Cited

U.S. PATENT DOCUMENTS

| | | | | |
|---|---|---|---|---|
| 7,483,823 | B2 * | 1/2009 | Alfieri ..................... | G06F 30/30 |
| | | | | 703/19 |
| 8,463,589 | B2 * | 6/2013 | Clark ................. | G06F 30/3308 |
| | | | | 703/22 |
| 8,639,487 | B1 * | 1/2014 | Ezer ..................... | G06F 30/327 |
| | | | | 716/102 |
| 8,694,947 | B1 * | 4/2014 | Venkataramani ....... | G06F 30/34 |
| | | | | 716/132 |
| 11,023,441 | B2 * | 6/2021 | Mugali ................... | G06N 3/08 |
| 11,093,864 | B1 * | 8/2021 | Reese ................. | G06F 16/2379 |
| 11,423,308 | B1 * | 8/2022 | Somanath .............. | G06N 3/094 |
| 11,720,732 | B2 * | 8/2023 | Cavitt .................. | G06F 30/398 |
| | | | | 716/111 |
| 2005/0060245 | A1 | 3/2005 | Hoffman et al. | |

| | | | | |
|---|---|---|---|---|
| 2012/0078580 | A1 | 3/2012 | Staples et al. | |
| 2014/0173546 | A1 * | 6/2014 | Kumar .................... | G06F 30/00 |
| | | | | 716/136 |
| 2018/0329935 | A1 * | 11/2018 | Mugali ................... | G06F 16/25 |
| 2021/0365770 | A1 * | 11/2021 | Bhatia .............. | G05B 19/41885 |
| 2022/0121800 | A1 * | 4/2022 | Kim ......................... | G06N 3/09 |
| 2022/0318678 | A1 * | 10/2022 | Kranski ................. | G06N 20/00 |
| 2023/0009941 | A1 * | 1/2023 | Peng ...................... | G06N 3/082 |
| 2023/0125401 | A1 * | 4/2023 | Lee ........................ | G06N 3/047 |
| | | | | 716/136 |
| 2024/0152508 | A1 * | 5/2024 | Nielsen ............... | G06F 16/2246 |
| 2024/0303241 | A1 * | 9/2024 | Gupta .............. | G06F 16/24564 |
| 2025/0165475 | A1 * | 5/2025 | Bagants ............. | G06F 21/6218 |

FOREIGN PATENT DOCUMENTS

| | | | | | | |
|---|---|---|---|---|---|---|
| CN | 107957867 | A | | 4/2018 | | |
| CN | 109189393 | A | | 1/2019 | | |
| CN | 110188454 | A | | 8/2019 | | |
| CN | 111045992 | A | | 4/2020 | | |
| CN | 111967137 | A | * | 11/2020 | ............ | G06F 30/20 |
| EP | 1498813 | A3 | * | 1/2007 | | |
| EP | 3934203 | A1 | * | 1/2011 | ............ | H04L 41/12 |
| JP | 2004272909 | A | | 9/2004 | | |
| JP | 2023173459 | A | * | 12/2023 | ............ | G05B 17/02 |
| KR | 101985395 | B1 | * | 6/2019 | ............ | G06Q 50/10 |
| TW | 201835784 | A | | 10/2018 | | |
| WO | WO-2025010212 | A1 | * | 1/2025 | ............ | G06N 20/00 |

* cited by examiner

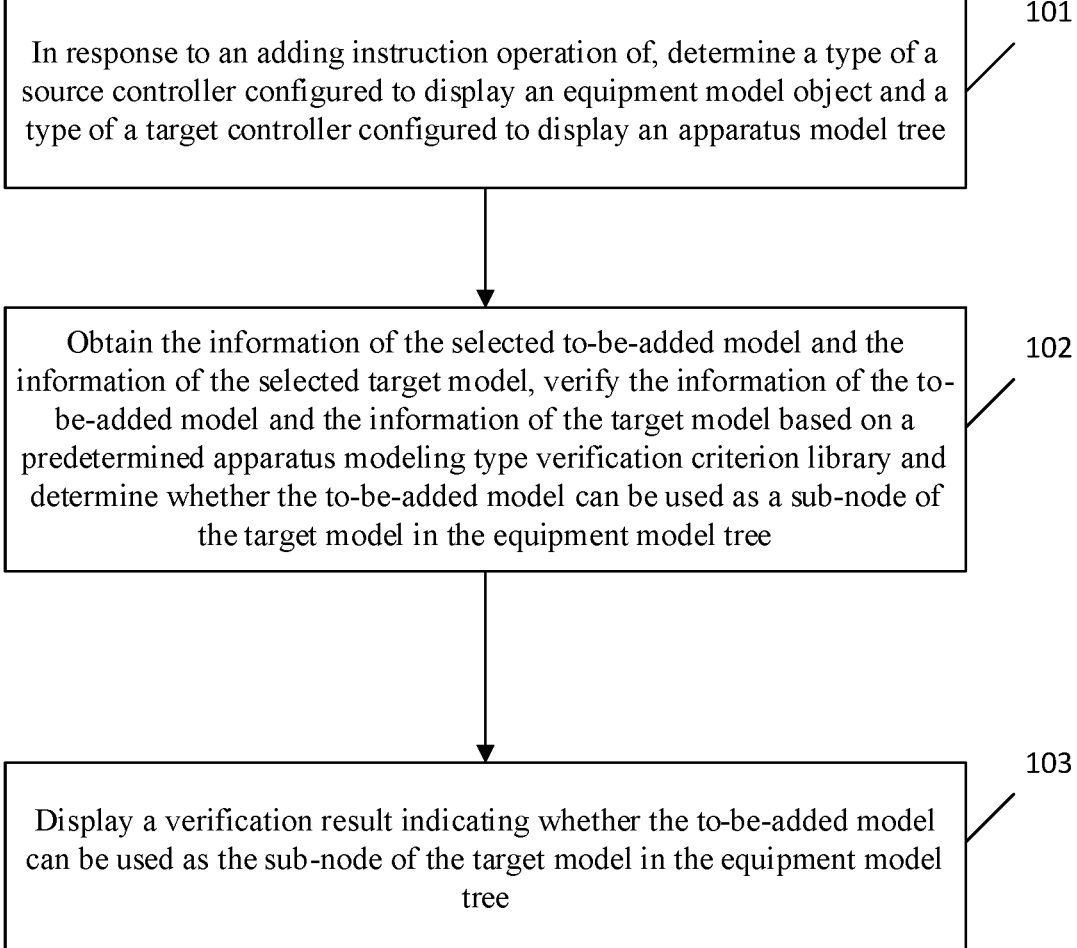

In response to an adding instruction operation of, determine a type of a source controller configured to display an equipment model object and a type of a target controller configured to display an apparatus model tree

101

Obtain the information of the selected to-be-added model and the information of the selected target model, verify the information of the to-be-added model and the information of the target model based on a predetermined apparatus modeling type verification criterion library and determine whether the to-be-added model can be used as a sub-node of the target model in the equipment model tree

102

Display a verification result indicating whether the to-be-added model can be used as the sub-node of the target model in the equipment model tree

SEMICONDUCTOR EQUIPMENT MODELING METHOD AND DEVICE

CROSS-REFERENCE TO RELATED APPLICATIONS

This application is a national phase entry under 35 U.S.C. § 371 of International Application No. PCT/CN2021/104679, filed on Jul. 6, 2021, which claims priority to Chinese Application No. 202010683246.9 filed on Jul. 15, 2020, the entire contents of both of which are incorporated herein by reference.

TECHNICAL FIELD

The present disclosure generally relates to the semiconductor field and, more particularly, to a semiconductor equipment modeling method and a semiconductor equipment modeling device.

BACKGROUND

Currently, during equipment modeling, a main program of an equipment modeling application uses a specific type of controller to display an equipment model object and a specific type of controller to display an equipment model tree. Thus, verification can be performed on whether a model selected in the equipment model object can be added to the equipment model tree to be used as a sub-node of the model selected in the equipment model tree. Codes related to the verification, that is, codes used to perform the verification on whether the model selected in the equipment model object can be added to the equipment model tree to be used as the sub-node of the model selected in the equipment model tree, are integrated into the main program.

On one hand, the verification can only be performed by the main program when the equipment model object is displayed with the specific type of controller and the equipment model tree is displayed with the specific type of controller. On another hand, during the equipment modeling, if the type of the controller for displaying the equipment model object is changed and/or the type of the controller for displaying the equipment model tree is changed according to the display requirements of the equipment modeling, the codes of the main program of the equipment modeling application related to the verification need to be reconstructed, which results in a high cost to adapt to display requirements of the equipment modeling.

SUMMARY

To overcome the problem of the related technology, the present disclosure provides a semiconductor equipment modeling method and device.

According to a first aspect of embodiments of the present disclosure, a semiconductor equipment modeling method is provided. The method includes: in response to an adding instruction operation, determining a type of a source controller configured to display an equipment model object and a type of a target controller configured to display an equipment model tree, the adding instruction operation being used to select a to-be-added model of the equipment model object and a target model of the equipment model tree; using a verification module corresponding to the type of the source controller and the type of the target controller to obtain information of the selected to-be-added model and information of the selected target model, and performing verification on the information of the to-be-added model and the information of the target model based on a predetermined equipment modeling type verification criterion library to determine whether the to-be-added model is able to be used as a sub-node of the target model in the equipment model tree; and displaying a verification result indicating whether the to-be-added model is able to be used as the sub-node of the target model in the equipment model tree.

In some embodiments, determining the type of the source controller configured to display the equipment model object and the type of the target controller configured to display the equipment model tree includes: using a pre-created generic-based function to determine the type of the source controller configured to display the equipment model object and the type of the target controller configured to display the equipment model tree, wherein a formal parameter of the generic-based function includes a formal parameter used to receive a source controller object of the source controller and a formal parameter used to receive a target controller object of the target controller, and when being called, the generic-based function is used to determine the type of the source controller object and the type of the target controller object through reflection to determine the type of the source controller and the type of the target controller.

In some embodiments, wherein in response to determining that the to-be-added model is able to be used as the sub-node of the target model of the equipment model tree, displaying the verification result indicating whether the to-be-added model is able to be used as the sub-node of the target model of the equipment model tree includes: displaying the verification result indicating that the to-be-added model is able to be used as the sub-node of the target model of the equipment model tree; the method further comprising, after displaying the verification result indicating whether the to-be-added model is able to be used as the sub-node of the target model of the equipment model tree: in response to an adding confirmation operation of a user, adding the to-be-added model to the equipment model tree as the sub-node of the target model.

In some embodiments, wherein in response to determining that the to-be-added model is able to be used as the sub-node of the target model of the equipment model tree, displaying the verification result indicating whether the to-be-added model is able to be used as the sub-node of the target model of the equipment model tree includes: displaying the verification result indicating that the to-be-added model is able to be used as the sub-node of the target model of the equipment model tree; the method further comprising, after displaying the verification result indicating whether the to-be-added model is able to be used as the sub-node of the target model of the equipment model tree: in response to an adding abandonment operation of a user, abandoning adding the to-be-added model to the equipment model tree.

In some embodiments, wherein responding to the adding instruction operation includes: dragging one to-be-added model of the displayed equipment model object to a position of one target model of the displayed equipment model tree.

In some embodiments, wherein the type of the source controller includes one of TreeView type and ListView type, and the type of the target controller includes one of TreeView type and ListView type.

In some embodiments, wherein the equipment modeling type verification criterion library includes an equipment modeling type verification criterion based on a data collection standard.

In some embodiments, wherein the data collection standard is a currently adopted version of data collection standard of a plurality of versions of data collection standards.

According to a second aspect of embodiments of the present disclosure, a semiconductor equipment modeling device is provided. The device includes: a determination unit configured to, in response to an adding instruction operation, determine a type of a source controller configured to display an equipment model object and a type of a target controller configured to display an equipment model tree, the adding instruction operation is used to select a to-be-added model of the equipment model object and a target model of the equipment model tree; a verification unit configured to use a verification module corresponding to the type of the source controller and the type of the target controller to obtain information of the selected to-be-added model and information of the selected target model, and perform verification on the information of the to-be-added model and the information of the target model based on a predetermined equipment modeling type verification criterion library to determine whether the to-be-added model is able to be used as a sub-node of the target model in the equipment model tree; and a feedback unit configured to display a verification result indicating whether the to-be-added model is able to be used as the sub-node of the target model in the equipment model tree.

The semiconductor device modeling method and device of embodiments of the present disclosure, on the one hand, can realize using the verification module independent of a main program to complete the verification. For the type of any source controller configured to display the equipment model object and the type of any target controller configured to display the equipment model tree, the corresponding verification module can perform verification on whether the selected to-be-added model of the equipment model object can be added to the equipment model tree to be used as the sub-node of the selected target model of the equipment model tree. The corresponding verification module can perform the verification when any one type of the controller is used to display the equipment model object and any one of the target controllers used to display the equipment model tree.

On another hand, when the type of the source controller configured to display the equipment model object and/or the type of the target controller configured to display the equipment model tree change, the corresponding verification module can be used to perform the verification. The main program does not include codes related to the verification. The main program will not be impacted to avoid the problem that the reconstruction needs to be performed on the codes related to the verification in the main program of the equipment modeling application to adapt to the display requirements of the equipment modeling in display.

BRIEF DESCRIPTION OF THE DRAWINGS

The accompanying drawings, which are incorporated in and form a part of the specification, illustrate embodiments of the present disclosure and are used to explain the principles of the present disclosure together with the description.

FIG. 1 is a schematic flowchart of an equipment modeling method according to some embodiments of the present disclosure.

4 model tree when a piece of semiconductor equipment is modeled according to some embodiments of the present disclosure.

Figure 3:
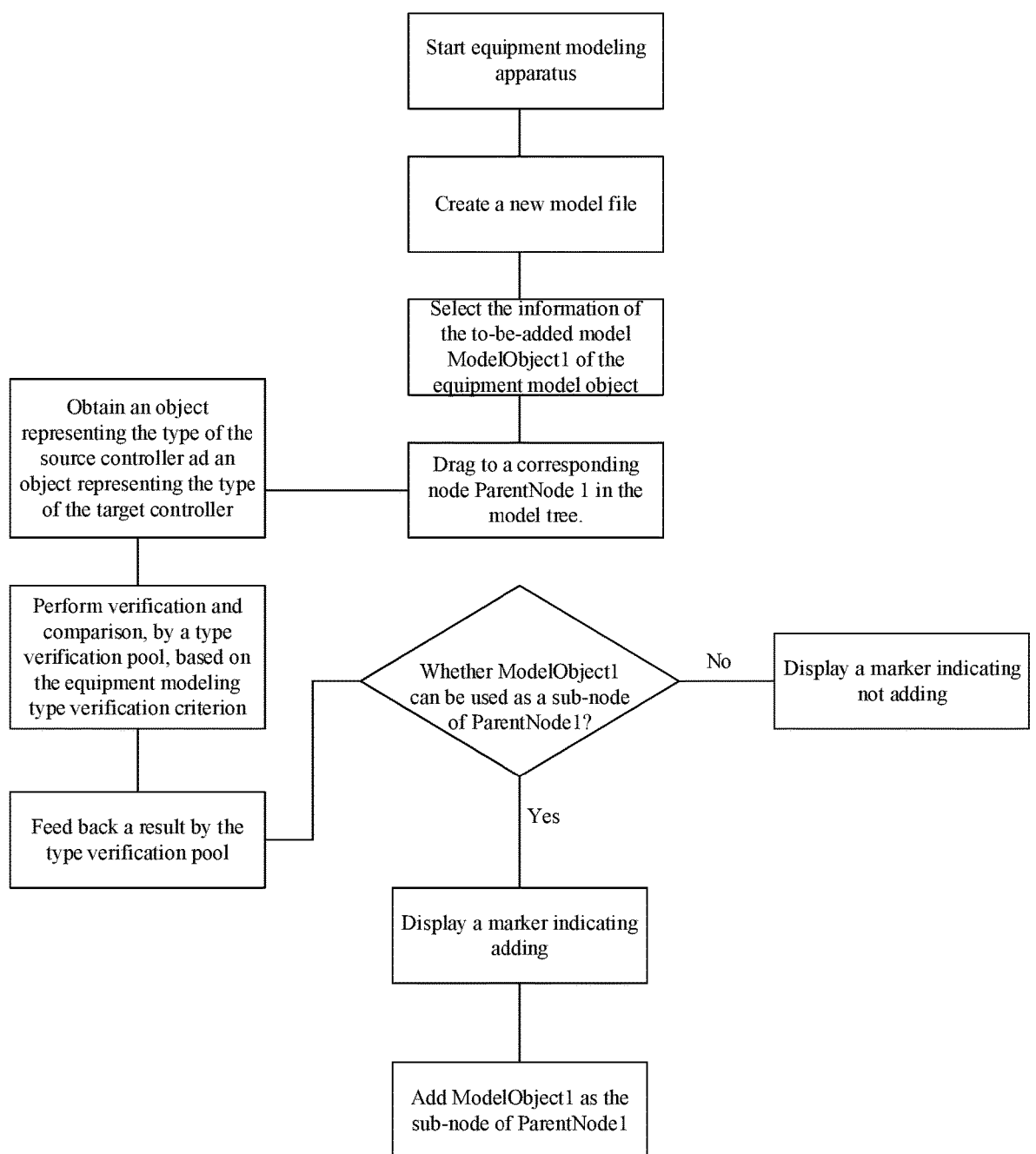

FIG. 3 is a schematic flowchart of modeling a piece of equipment according to some embodiments of the present disclosure.

Figure 4:
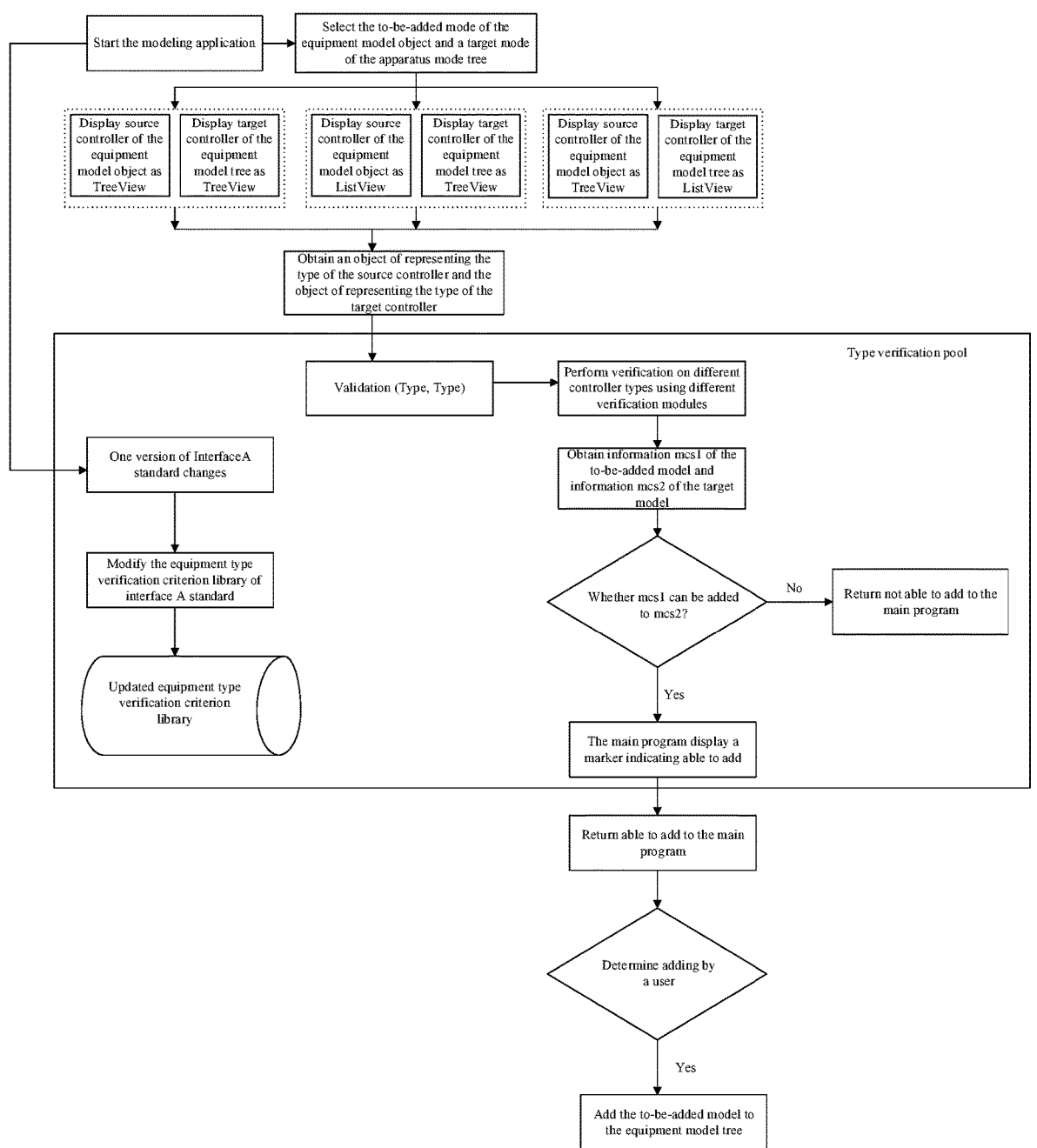

FIG. 4 is a schematic diagram showing a principle of modeling a piece of equipment according to some embodiments of the present disclosure.

Figure 5:
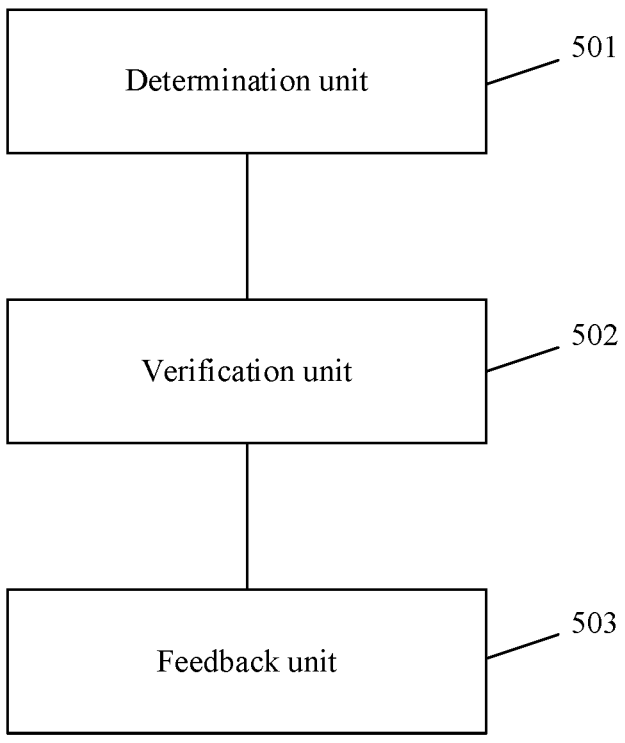

FIG. 5 is a schematic structural block diagram of an equipment modeling device according to some embodiments of the present disclosure.

DETAILED DESCRIPTION OF THE
EMBODIMENTS

The present disclosure is described in detail below with reference to the accompanying drawings and embodiments. Specific embodiments described here are only used to illustrate and explain the present disclosure, but not to limit the present disclosure. In addition, to facilitate description, the accompanying drawings only illustrate parts related to the present disclosure.

It needs to be noted that embodiments of the present disclosure and the features of the embodiments can be combined with each other when there is no conflict. The present disclosure is described in detail below with reference to the accompanying drawings and in connection with the embodiments.

FIG. 1 is a schematic flowchart of an equipment modeling method according to some embodiments of the present disclosure. The method includes the following processes.

At 101, in response to an adding instruction operation, a type of a source controller configured to display an equipment model object and a type of a target controller configured to display an equipment model tree are determined.

The source controller configured to display the equipment model object can refer to a controller currently configured to display the equipment model object. A target controller configured to display the equipment model tree can refer to the controller currently configured to display the equipment model tree.

For example, the type of the source controller can be a ListView type. The type of the target controller can be a TreeView type. During the equipment modeling, in an equipment modeling interface, the equipment model object can be displayed to a user through a source controller of the ListView type, and the equipment model tree can be displayed to the user through a target controller of the TreeView type.

When a piece of semiconductor equipment is modeled, the main program in the equipment modeling application can call the source controller to display the equipment model object and call the target controller to display the equipment model tree.

In the present disclosure, a model selected by the user in the equipment model object during the semiconductor equipment modeling can be referred to as a model to be added (to-be-added model).

A model selected by the user in the equipment model tree during the equipment modeling can be referred to as a target model.

The above adding instruction operation in step 101 can be used to select the model to be added to the equipment model object and the target model in the equipment model tree.

For example, when performing modeling on the semiconductor equipment, in response to the adding indication operation, the method can include:

in response to the user, dragging a to-be-added model in the displayed equipment model object to a position of the target model in the displayed equipment model tree.

In some embodiments, in the above adding instruction operation, a click action can first be performed to select the model to be added to the equipment model object, and then a click action can be performed to select the target model in the equipment model tree. Then, the selected to-be-added model can be dragged to the position of the selected target model. Alternatively, in the above adding instruction operation, only one click can be performed to select a to-be-added model in the equipment model object. Then, the selected to-be-added model can be dragged to the position of the corresponding target model.

The above dragging action can include that the user can drag an information item in the information displayed by a source controller to the position of an information item in the information displayed by the target controller. After the dragging action is completed, the selected to-be-added model can be dragged to the position of the selected target model.

It needs to be noted that the above adding instruction operation is not limited to dragging. In practical applications, any other method can also be used to add a to-be-added model in the displayed equipment model object to a position of a target model in the displayed equipment model tree. For example, one-click action can be performed to select a to-be-added model in the equipment model object. Then, the to-be-added model can be added to the position of the target model in the equipment model tree in any gesture or action.

During the equipment modeling, the adding instruction operation can be detected by the main program in the equipment modeling application. When the adding instruction operation is detected, the module configured to determine the type of the controller in the equipment modeling application can determine the type of the source controller configured to display the equipment model object and the type of the target controller configured to display the equipment model tree. In the main program in the equipment modeling application, the type of the source controller and the type of the target controller do not need to be considered, and information of the corresponding module that is selected does not need to be obtained. In the present disclosure, a corresponding verification module can be configured to obtain the information of the corresponding module that is selected.

During the equipment modeling, the user can select the corresponding to-be-added model in the equipment model object and the corresponding target model in the equipment model tree each time the user performs an adding instruction operation.

In the present disclosure, the type of the source controller and the type of the target controller can be recorded in a configuration file of the equipment modeling application.

When the type of the source controller configured to display the equipment model object and the type of the target controller configured to display the equipment model tree need to be determined, the type of the source controller and the type of the target controller can be obtained by reading the above configuration file.

In the present disclosure, the equipment model object can include a plurality of models.

Each model in the equipment model object can be associated with a data structure related to the semiconductor equipment. For example, if the equipment is a robot, a model in the equipment model object can be associated with a data structure that is used to describe a mechanical arm of the robot (i.e., a robotic arm). Another model in the equipment model object can be associated with a data structure used to store a parameter of a certain type of robot.

In the equipment model tree, an association relationship between different models in the equipment model tree can be clearly represented by the tree structure. Since different models can each be associated with a data structure associated with the semiconductor equipment. Therefore, through the equipment model tree, the association relationship between different data structures associated with the semiconductor manufacturing equipment can be clearly represented. The above equipment model tree can be provided for a management system and data acquisition application of the plant. The data acquisition application can store the collected data related to semiconductor equipment in the data structure associated with the corresponding model according to a SEMI InterfaceA standard. A server of the factory management system can read the corresponding data related to the semiconductor equipment from the corresponding data structure associated with the model according to the SEMI InterfaceA standard.

In the equipment model tree, each model can be used as a node.

Each model in the equipment model tree can include at least one parent node and/or at least one sub-node.

In the present disclosure, a same model in the equipment model object can be added to the equipment model tree multiple times as a sub-node of the corresponding target model.

For a model in the equipment model object, each time the model is added to the equipment model tree, the name of the model in the equipment model tree can be modified. The equipment model tree can include a plurality of models that have the same type as the model and a name different from the model and are located at different positions.

Figure 2:
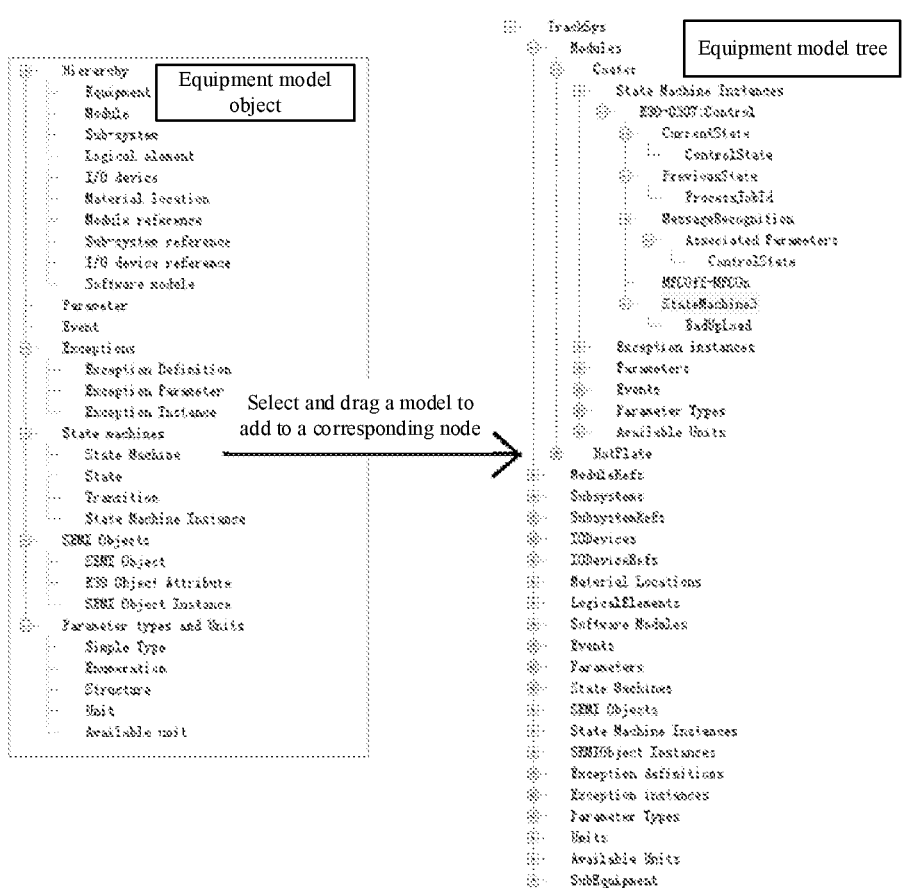
FIG. 2 is a schematic diagram showing an effect of displaying an equipment model object and an equipment

FIG. 2 is a schematic diagram showing an effect of displaying an equipment model object and an equipment model tree when a piece of semiconductor equipment is modeled according to some embodiments of the present disclosure.

In the equipment model object, the sub-node can be a model in the equipment model object, e.g., each item under "Hierarchy," "Parameter," "Event," each item under "Exceptions," each item under "State Machines," etc. In the equipment model tree, some models in the equipment model tree can be displayed according to a subordinate relationship. The user can click "+" on a left side of a model having sub-nodes to further display models that are used as the sub-nodes of that model.

In some embodiments, determining the type of the source controller configured to display the equipment model object and the type of the target controller configured to display the equipment model tree can include using a pre-created generics-based function to determine the type of the source controller configured to display the equipment model object and the type of the target controller configured to display the equipment model tree. A formal parameter of the generics-based function can include a formal parameter used to receive a source controller object of the source controller and a formal parameter used to receive a target controller object of the target controller. The generics-based function, when called, can be used to determine the type of the source controller object and the type of the target controller object through reflection to determine the type of the source controller and the type of the target controller.

In the present disclosure, the equipment modeling application can be developed using the C# language. When the type of the source controller configured to display the equipment model object and the type of the target controller configured to display the equipment model tree are determined, the predefined generic-based function can be used to determine the type of the source controller configured to display the equipment model object and the type of the target controller configured to display the equipment model tree.

Two generic type formal parameters based on the generic-based function can be provided. The two generic type formal parameters can be a T parameter type belongs to a generic type in the C# language.

Each type of the controller that can be configured to display the equipment model object and each type of the controller that can be configured to display the equipment model tree can be defined in advance as a base class of the T parameter type in the C# language. Thus, one of the two generic type formal parameters of the generic-based function can be used as a generic type formal parameter that can be used to receive an object representing the type of the source controller, and the other formal parameter can be used to receive a generic type formal parameter of an object representing the type of the target controller.

When the type of the source controller configured to display the equipment model object and the type of the target controller configured to display the equipment model tree need to be determined, the main program can be used to the object representing the type of the source controller and the object representing the type of the target controller from a storage position of codes of the source controller and a storage position of codes of the target controller. The main program can also be used to call the generic-based function to use the object representing the type of the source controller and the object representing the type of the target controller as actual parameters for input. The object representing the type of the source controller can be used as an actual parameter to be transmitted to a generic type formal parameter that can be used to receive the object representing the type of the target controller.

Therefore, the generic-based function, when called, can be used to obtain the type of the source controller through a reflection mechanism of the C# language based on the object representing the type of the source controller, and obtain the type of the target controller through the reflection mechanism of the C# language based on the object representing the type of the target controller.

At 102, the verification module corresponding to the type of the source controller and the type of the target controller is configured to obtain the information of the selected to-be-added model and the information of the selected target model, verify the information of the to-be-added model and the information of the target model based on a predetermined equipment modeling type verification criterion library and determine whether the to-be-added model can be used as a sub-node of the target model in the equipment model tree.

In the present disclosure, after the type of the source controller and the type of the target controller are determined, the verification module corresponding to the type of the source controller and the type of the target controller can be used to obtain the information of the selected to-be-added model and the information of the selected target model.

The type of the source controller and the type of the target controller can form a controller type combination.

Therefore, the verification module corresponding to the type of the source controller and the type of the target controller may refer to a verification module corresponding to the controller type combination formed by the type of the source controller and the type of the target controller.

In the present disclosure, the type that represents the source controller of the equipment model object can be referred to as a candidate controller type of the equipment model object.

The type that represents the target controller of the equipment model tree can be referred to as a candidate controller type of the equipment model tree.

By combining the candidate controller type of the equipment model object and the candidate controller type of the equipment model tree, a plurality of controller type combinations can be obtained.

In the present disclosure, the equipment modeling application can include a plurality of verification modules independent of the main program.

Each verification module can correspond to a controller type combination.

Correspondingly, each verification module can correspond to a controller type and another controller type in the controller type combination corresponding to the verification module.

For example, all candidate controller types of the equipment model object can include a ListView type and a TreeView type. All candidate controller types of the equipment model tree can include a ListView type and a TreeView type.

The candidate controller types of the equipment model object and the candidate controller types of the equipment model tree can be combined to obtain four controller type combinations. Assume that a first controller type combination can include a TreeView type and a TreeView type. A second controller type combination can include a ListView type and a TreeView type. A third control type combination can include a TreeView type and a ListView type.

Correspondingly, the equipment modeling application can include four verification modules. Each verification module can correspond to a controller type combination.

Assume that the type of the source controller configured to display the equipment model object is the ListView type, and the type of the target controller configured to display the equipment model tree is the TreeView type, the verification module corresponding to the controller type combination composed of the ListView type and the TreeView type can be used to obtain the information of the selected to-be-added model and the information of the selected target model.

For the source controller configured to display the equipment model object, information of each mode in the equipment model object can correspond to a node of the source controller.

For the target controller configured to display the equipment model tree, information of each model in the equipment model tree can correspond to a node of the target controller.

During the equipment modeling, when a to-be-added model in the equipment model object is selected, for the source controller configured to display the equipment model object, a node in the source controller corresponding to the selected to-be-added model information can be selected. The attribute information of the source controller can include an identification of the currently selected node. The verification module corresponding to the type of the source controller and the type of the target controller, i.e., the verification module corresponding to the controller type combination composed of the type of the source controller and the type of the target controller, can obtain the identification of the currently selected node from the storage position of the attribute information of the source controller to determine that the node corresponding to the selected to-be-added model information is selected. The attribute information of the node corresponding to the selected to-be-added model information can include the information of the to-be-added model. The information of the to-be-added model can be the only identification, with which the to-be-added model can be distinguished from the other models. Thus, the information of the selected to-be-added module can be obtained.

During the equipment modeling, when a target model information in the equipment model tree is selected, for the target controller configured to display the equipment model tree, a node in the target controller corresponding to the selected target model information is selected.

The verification module corresponding to the type of the source controller and the type of the target controller, that is, the verification module corresponding to the controller type combination composed of the type of the source controller and the type of the target controller, can obtain the identification of the currently selected node from the storage position of the attribute information of the target controller to determine that the node corresponding to the selected target model is selected. The attribute information corresponding to the node of the selected target model can include the information of the target model. The information of the target model can be the only identification, with which the target model can be distinguished from the other models. Thus, the information of the selected target model can be obtained.

For example, the type of the source controller configured to display the equipment model object can be the ListView type, and the type of the target controller configured to display the equipment model tree can be the TreeView type. The verification module corresponding to the ListView type and the TreeView type, i.e., the verification module of the controller type combination composed of the ListView type and the TreeView type, can be configured to obtain the information of the selected to-be-added model and the information of the target model.

In the present disclosure, when the type of the source controller changes and/or the type of the target controller changes, the codes of the main program do not need to be changed.

For example, the type of the source controller configured to display the equipment model object can be ListView, and the type of the target controller configured to display the equipment model tree can be TreeView.

When the type of the source controller configured to display the equipment model object is changed from List-View to TreeView, and the type of the target controller configured to display the equipment model tree is still TreeView, the verification module corresponding to the controller type combination composed of the TreeView type and the TreeView type can be used to perform the verification without changing the codes of the main program.

In the present disclosure, after the verification module corresponding to the type of the source controller and the type of the target controller obtains the information of the selected to-be-added model and the information of the target model, the verification module corresponding to the type of the source controller and the type of the target controller can perform the verification on the information of the to-beadded model and the information of the target model based on the predetermined equipment modeling type verification criterion library to determine whether the to-be-added model can be used as the sub-node of the target model in the equipment model tree.

The equipment modeling type verification criterion library can include information of each model in the equipment model object and equipment modeling type verification criteria corresponding to each model in the equipment model object.

For each model in the equipment model object, the information of the model and the equipment modeling type verification criteria corresponding to the model can be stored in the equipment modeling type verification criterion library.

For each model in the equipment model object, the equipment modeling type verification criteria corresponding to the model can include all types of models that can become parent nodes of the model in the equipment model tree.

When the verification is performed on the information of the to-be-added model and the information of the target model to determine whether the to-be-added model can be used as a sub-node of the target model in the equipment model tree, the equipment modeling type verification criteria corresponding to the to-be-added model can be first searched in the equipment modeling type criterion verification library according to the information of the to-be-added model. Then, all types of models that can become the parent nodes of the to-be-added model and is in the equipment model tree can be further obtained from the equipment modeling verification criteria corresponding to the to-be-added model. Then, whether all the types of the models that are in the equipment model tree and can become the parent nodes of the information of the to-be-added model include the type of the information of the target model can be determined. If all the types of the models that are in the equipment model tree and can become the parent nodes of the information of the to-be-added model are determined to include the type of the information of the target model, the information of the to-be-added model can be determined to be able to be added into the equipment model tree to be used as a sub-node of the information of the target model.

In some embodiments, the equipment modeling type verification criterion library can include the equipment modeling type verification criteria based on a data collection standard.

In the present disclosure, the data collection standard can be the SEMI InterfaceA standard.

For each model in the equipment model object, the model can be used as the sub-node of the model in the equipment model tree, and the type of the model in the equipment model tree can be defined in the SEMI Interface A standard. Based on the SEMI InterfaceA standard, the equipment modeling type verification criteria corresponding to each model in the equipment model object can be pre-created based on the SEMI Interface A standard to obtain the equipment modeling type verification criterion library.

In some embodiments, for the predetermined equipment modeling type verification criterion library currently used to determine whether the to-be-added model can be used as the sub-node of the target model in the equipment model tree, the data collection standard on which the equipment model type verification criteria in the predetermined equipment model type verification criterion library are based can be the data collection standard of the current version adopted in a plurality of data collection standards.

The currently adopted version of the data collection standard can refer to the currently used SEMI InterfaceA standard of a plurality of versions of the SEMI InterfaceA standards.

For example, the SEMI InterfaceA standard of version 1105 and the SEMI InterfaceA standard of version 0710 can be pre-defined. The current version can be the SEMI InterfaceA standard of version 0710. Which version of the SEMI InterfaceA standard is currently used can be determined according to the data transmission requirements of the data collection application and the semiconductor manufacturing equipment in the factory and the data transmission requirements of the server of the factory management system and the semiconductor manufacturing equipment in the factory.

In the present disclosure, for each version of the SEMI InterfaceA standard, an equipment modeling type verification criterion library of the version of the SEMI InterfaceA standard can be established.

Correspondingly, for each version of the SEMI InterfaceA standard, the equipment modeling type verification criteria in the equipment modeling type verification criterion library of the version of the SEMI InterfaceA standard can be based on the equipment modeling type verification criteria of the version of the SEMI InterfaceA standard.

When a SEMI InterfaceA standard is currently used, the equipment modeling type verification criterion library of the SEMI InterfaceA standard can be used as the predetermined equipment modeling type verification criterion library used to determine whether the to-be-added model can be used as the sub-node of the target model in the equipment model tree.

At 103, a verification result indicating whether the to-be-added model can be used as the sub-node of the target model in the equipment model tree is displayed.

In the present disclosure, after whether the information of the to-be-added model can be added to the equipment model tree as the sub-node of the information of the target model, the verification result can be displayed to the user.

When the to-be-added model information is determined to be able to be added to the equipment model tree as the sub-node of the target model information, a verification result indicating that the to-be-added model can be added to the equipment model tree as the sub-node of the target model information can be displayed to the user. For example, a marker indicating that the to-be-added model can be added to the equipment model tree as the sub-node of the target model can be displayed to the user.

When the to-be-added model information is determined to not be able to be added to the equipment model tree as the sub-node of the target model information, a verification result indicating that the to-be-added model cannot be added to the equipment model tree as the sub-node of the target model information can be displayed to the user. For example, a marker indicating that the to-be-added model cannot be added to the equipment model tree as the sub-node of the target model can be displayed to the user.

In some embodiments, when the to-be-added model is determined to be able to be used as the sub-node of the target model in the equipment model tree, displaying the verification result indicating whether the to-be-added model information can be used as the sub-node of the target model information in the equipment model tree can include displaying the verification result indicating that the to-be-added model information can be used as the sub-node of the target model information in the equipment model tree. After displaying the verification result indicating whether the to-be-added model information can be used as the sub-node of the target model information in the equipment model tree, the method can further include in response to an adding confirmation operation of the user, adding the to-be-added model to the equipment model tree as the sub-node of the target model.

When the verification result indicates that the to-be-added model can be used as the sub-node of the target model, after displaying the verification result indicating that the to-be-added model can be added to the equipment model tree as the sub-node of the target model to the user, if the user determines to add the to-be-added model to the equipment model tree, the user can perform the addition confirmation operation. The to-be-added model can be added to the equipment model tree as the sub-node of the target model in response to the adding confirmation operation of the user.

In some embodiments, when the to-be-added model is determined to be able to be used as the sub-node of the target model in the equipment model tree, displaying the verification result indicating whether the to-be-added model can be used as the sub-node of the target model in the equipment model tree can include displaying the verification result indicating that the to-be-added model can be used as the sub-node of the target model in the equipment model tree. After displaying the verification result indicating whether the to-be-added model can be used as the sub-node of the target model in the equipment model tree, the method can further include in response to an adding abandonment operation of the user, abandoning adding the to-be-added model to the equipment model tree.

After displaying the verification result indicating that the to-be-added model can be added to the equipment model tree as the sub-node of the target model to the user, if the user abandons adding the to-be-added model to the equipment model tree, the user can perform the adding abandonment operation. The to-be-added model can be abandoned from being added to the equipment model tree in response to the adding abandonment operation of the user.

In some embodiments, in response to a change in the data collection standard, the equipment modeling type verification criteria based on the data collection standard in the equipment modeling type verification criterion library can be modified.

In the present disclosure, if any version of the data collection standard changes, the corresponding equipment modeling type verification criteria based on the data collection standard in the equipment modeling type verification criterion library of the changed data collection standard can be modified to obtain the corresponding updated equipment modeling type verification criterion library.

Taking the currently adopted version of the SEMI InterfaceA standard of the plurality of versions of the SEMI InterfaceA standards as an example, when at least one model in the equipment modeling object that is defined by adopting the current SEMI InterfaceA standard and can be used as the parent node of the model changes, the currently adopted version of the SEMI InterfaceA standard can be changed.

When the currently adopted version of the SEMI InterfaceA standard changes, the corresponding equipment modeling type verification criteria that is, in the equipment modeling type verification criterion library of the currently adopted version of the SEMI InterfaceA standard and based on the currently adopted version of the SEMI InterfaceA standard, i.e., the equipment modeling type verification criteria corresponding to each model in which the type of the parent node of the model changes, can be modified to obtain an updated equipment modeling type verification criterion library of the currently adopted version of the SEMI InterfaceA standard.

That is, for the currently adopted version of the SEMI InterfaceA standard, and for each model in the equipment model object that can be used as the parent node of the model whose type changes, the equipment modeling type verification criteria corresponding to the model in the equipment modeling type verification criterion library of the currently adopted version of the SEMI InterfaceA standard can be modified to obtain the updated equipment modeling type verification criterion library of the currently adopted version of the SEMI InterfaceA standard.

In the present disclosure, the equipment modeling type verification criterion library of any version of the SEMI InterfaceA standard can be independent of the main program. Meanwhile, any equipment modeling type verification criterion in the equipment modeling type verification criterion library of any version of the SEMI InterfaceA standard can be independent of the main program.

If any version of the SEMI InterfaceA standard changes, the corresponding equipment modeling type verification criterion based on the changed version of the SEMI InterfaceA standard in the equipment modeling type verification criterion library of the changed version of the SEMI InterfaceA standard can be modified correspondingly.

Thus, for any version of the SEMI InterfaceA standard, if the equipment modeling type verification criterion library of the version of the SEMI InterfaceA standard is currently used as the predetermined equipment modeling type verification criterion library that is used to determine whether the to-be-added model can be used as the sub-node of the target model in the equipment model tree, when the version of the SEMI InterfaceA standard changes, the updated equipment modeling type verification criterion library of the version of the SEMI InterfaceA standard can be generated.

After the version of the SEMI InterfaceA standard changes, the updated equipment modeling type verification criterion library of the version of the SEMI InterfaceA standard can be used as the predetermined equipment modeling type verification criterion library that is currently used to determine whether the to-be-added model can be used as the sub-node of the target model in the equipment modeling tree. Thus, in the subsequent verification process, whether the to-be-added model can be used as the sub-node of the target model in the equipment model tree can be determined.

For any version of the SEMI InterfaceA standard, if the equipment modeling type verification criterion library of the version of the SEMI InterfaceA standard is used as the predetermined equipment modeling type verification criterion library that can be used to determine whether the to-be-added model can be used as the sub-node of the target model in the equipment model tree, when the version of the SEMI InterfaceA changes, since the main program does not include codes related to the verification process, codes of the main program does not need to be modified. That is, the codes of the main program does not need to be reconstructed. Meanwhile, the codes of the verification model related to the verification process also does not need to be modified. Thus, the equipment modeling application can be easy to maintain. Meanwhile, the operation efficiency of equipment modeling codes can be improved to avoid the reconstruction of a large amount of codes due to the change in the SEMI InterfaceA standard. The development cost can be saved, and the maintenance cost can be reduced.

FIG. 3 is a schematic flowchart of modeling a piece of equipment according to some embodiments of the present disclosure.

The equipment modeling application is started.

A new model file is created. The newly created model file can include an equipment model object.

The to-be-added model information Model Object1 is selected from the equipment model object.

The to-be-added model information Model Object1 is dragged to the corresponding node Parent Node1 in the equipment model tree, i.e., the target model.

The type of the source controller and the type of the target controller are obtained.

A type verification pool integrates a plurality of verification modules and an equipment modeling type verification criterion library of a plurality of versions of SEMI InterfaceA.

The type verification module corresponding to the type of the source controller and the type of the target controller in the type verification pool can perform verification and comparison according to the equipment modeling type verification criteria based on the current version of SEMI InterfaceA to determine whether the selected to-be-added model can be added to the equipment model tree as the sub-node of the target model to obtain a feedback result.

The type verification pool feeds back the feedback result to the main program.

If the feedback result indicates that the to-be-added model can be added to the equipment model tree as the sub-node of the target model, a mark indicating that the to-be-added model can be added can be displayed. Model Object1 can be added to the equipment model tree as the sub-node of Parent Node1.

If the feedback result indicates that the to-be-added model cannot be added to the equipment model tree as the sub-node of the target model, a mark indicating that the to-be-added model cannot be added can be displayed.

FIG. 4 is a schematic diagram showing a principle of modeling a piece of equipment according to some embodiments of the present disclosure.

FIG. 4 illustrates three display cases of the type of the source controller being a TreeView type and the type of the target controller being a TreeView type. The type of source controller is a ListView type and the type of target controller is a TreeView type. The type of source controller is a TreeView type and the type of target controller is a ListView type.

No matter what kind of display situation, the corresponding verification module can be used for verification. Any verification module can be independent of the main program.

When the type of the source controller configured to display the equipment model object is the ListView type, and the type of the target controller configured to display the equipment model tree is the TreeView type, the verification module corresponding to the type of the source controller and the type of the target controller, i.e., the verification module corresponding to the controller type combination composed of the ListView type and the TreeView type.

Meanwhile, the codes of the main program do not need to be modified when changing from one display situation to another.

For example, the type of the source controller configured to display the equipment model object can be the ListView type. The type of the target controller configured to display the equipment model tree can be the TreeView type. When the type of the source controller configured to display the equipment model object is changed from the ListView type to the TreeView type, and the type of the target controller configured to display the equipment model tree is still the TreeView type, the verification module of the controller type combination composed of the TreeView type and the TreeView type can be used to perform the verification without modifying the codes of the main program.

If any version of the SEMI InterfaceA standard changes, the equipment modeling type verification criteria based on the changed version of the SEMI InterfaceA standard in the equipment modeling type verification criterion library of the changed version of the SEMI InterfaceA standard can be modified. Since the main program does not include the verification codes, the codes of the main program do not need to be modified when any version of the SEMI Inter-faceA standard changes and the codes related to the verification process also does not need to be modified.

In FIG. 4, the generic-based function can be represented by Validation(Type, Type). Validation(Type, Type) can be called by the main program. An object representing the type of the source controller and an object representing the type of the target controller can be passed in as actual parameters. When being called, Validation(Type, Type) is used to obtain the type of the source controller through a reflection mechanism of C# language based on the object representing the type of the source controller and obtain the type of the target controller through the reflection mechanism of the C# language based on the object representing the type of the target controller.

The above steps 101-103 exemplarily describe the operations that need to be performed once in the process of verifying whether the selected to-be-added model can be used as the sub-node of the target model in the equipment model tree.

When the semiconductor equipment is modeled, each time the user wants to add a model in the equipment model object to the equipment model tree as a sub-node of a target model, the above steps 101-103 can be executed.

FIG. 5 is a schematic structural block diagram of an equipment modeling device according to some embodiments of the present disclosure. The semiconductor device modeling device includes a determination unit 501, a verification unit 502, and a feedback unit 503.

The determination unit 501 can be configured to, in response to the adding instruction operation, determine the type of the source controller configured to display the equipment model object and the type of the target controller configured to display the equipment model tree. The adding instruction operation can be used to select the to-be-added model in the equipment model object and the target model in the equipment model tree.

The verification unit 502 can be configured to use the verification module corresponding to the type of the source controller and the type of the target controller to obtain the information of the selected to-be-added model and the information of the selected target model, perform the verification on the information of the to-be-added model and the information of the target model based on the predetermined equipment modeling Type verification criterion library to determine whether the to-be-added model can be used as the sub-node of the target model in the equipment model tree.

The feedback unit 503 can be configured to display the verification result indicating whether the to-be-added model can be used as the sub-node of the target model in the equipment model tree.

In some embodiments, the determination unit 501 can be further configured to determine the type of the source controller configured to display the equipment model object and the type of the target controller configured to display the equipment model tree by using the pre-created generic-based function. The formal parameter of the generic-based function can include the formal parameter of the source controller object configured to receive the source controller and the formal parameter of the target controller object configured to receive the target controller. When the generic-based function is called, the generic-based function can be used to determine the type of the source controller object and the type of the target controller object through the reflection to determine the type of the source controller and the type of the target controller.

In some embodiments, the feedback unit 503 can be further configured to, when the to-be-added model can be used as the sub-node of the target model in the equipment model tree, display the verification result indicating that the to-be-added model can be used as the sub-node of the target model in the equipment model tree.

The semiconductor device modeling equipment also includes: an adding unit configured to, after the feedback unit 503 displays the verification result indicating whether the to-be-added model can be used as the sub-node of the target mode in the equipment model tree, add the to-be-added model to the equipment model tree as the sub-node of the target model in response to the adding confirmation operation of the user.

In some embodiments, when the to-be-added model is determined to be able to be used as the sub-node of the target model in the equipment model tree, the feedback unit 503 can be further configured to display the verification result indicating that the to-be-added model can be used as the sub-node of the target model in the equipment model tree.

The semiconductor device modeling equipment further includes: an adding abandonment unit configured to, after the feedback unit 503 displays the verification result indicating whether the to-be-added model can be used as the sub-node of the target model in the equipment model tree, abandon adding the to-be-added model into the equipment model tree in response to the adding abandonment operation of the user.

In some embodiments, the adding instruction operation can include dragging the selected to-be-added model to the position of the selected target model.

In some embodiments, the type of the source controller can include one of the TreeView type and the ListView type. The type of the target controller can be one of the TreeView type and the ListView type.

In some embodiments, the data collection standard can be the currently adopted version of the data collection standard of the plurality of versions of the data collection standards.

In some embodiments, the semiconductor equipment modeling equipment can further include: a modification unit configured to modify the equipment modeling type verification criteria based on the data collection standard in the equipment modeling type verification criterion library in response to the change of the data collection standard.

The present disclosure further provides an electronic equipment. The electronic equipment can include one or more processors and a memory used to store one or more programs. The one or more programs may include an instruction used to execute the operation described in the above embodiments. When the one or more programs are executed by the plurality of processors, the one or more processors can be configured to perform the instruction for executing the operation describe in the above embodiments.

The present disclosure further provides a computer-readable medium. The computer-readable medium can be included in the electronic equipment or exist alone without being assembled into the electronic equipment. The above computer-readable medium can store one or more programs. When the one or more programs are executed by the electronic equipment, the electronic equipment can be caused to perform the operations described in the above embodiments.

The computer-readable medium described in the present disclosure can be a computer-readable signal medium or a computer-readable storage medium, or any combination thereof. The computer-readable storage medium can include but is not limited to, electrical, magnetic, optical, electromagnetic, infrared, or semiconductor systems, equipment, or devices, or any combination thereof. A more specific example of the computer-readable storage medium can include, but is not limited to, an electrical connection with one or more wires, portable computer disks, hard disks, random access memory (RAM), read-only memory (ROM), erasable Programmable read-only memory (EPROM or flash memory), optical fiber, portable compact disk read-only memory (CD-ROM), an optical storage device, a magnetic storage device, or any suitable combination thereof. In the present disclosure, the computer-readable storage medium can include any tangible medium that includes or stores a program that can be used by or in connection with a message execution system, equipment, or device. In the present disclosure, the computer-readable signal medium can include a data signal propagated in a baseband or as a part of a carrier wave, which carries the computer-readable program codes. Such propagated data signals can include a variety of forms, including but not limited to an electromagnetic signal, an optical signal, or any suitable combination thereof. The computer-readable signal medium can also be any computer-readable medium other than a computer-readable storage medium. The computer-readable medium can be used to transmit, propagate, or transport a program used by or used in connection with the execution system, equipment, or device. The program codes included in the computer-readable medium can be transmitted using any suitable medium including, but not limited to, wireless, wire, optical fiber cable, radio frequency (RF), etc., or any suitable combination thereof.

The flowchart and block diagram in the accompanying drawings illustrate the architecture, functionality, and operation of possible implementations of systems, methods, and computer program products according to various embodiments of the present disclosure. Thus, each block in the flowchart or block diagrams can represent a module, a segment, or a portion of codes. The module, the segment, and the portion of codes can include one or more executable messages used to implement the specified logical functions. In some alternative implementations, the functions noted in the blocks can occur in a sequence different from the sequence noted in the accompanying drawings. For example, two blocks that are shown in connection, can, in fact, be executed substantially in parallel or can sometimes be executed in a reverse order, which depends upon the functionality involved. Each block of the block diagrams and/or flowcharts and a combination of the blocks of the block diagrams and/or flowcharts can be implemented by a dedicated hardware-based system that performs the specified functions or operations or can be implemented with a combination of the dedicated hardware and the computer messages.

The above description is only a preferred embodiment of the present disclosure and an illustration of the applied technical principles. Those skilled in the art should understand that the scope involved in the present disclosure is not limited to the technical embodiments formed by the specific combination of the above technical features, and should also be included in other technical embodiments formed by any combination of the above technical features or the equivalent features without departing from the inventive concept. For example, technical embodiments can be formed by replacing the above features with the technical features disclosed in the present disclosure (but not limited to) having similar functions with each other.

What is claimed is:

1. A semiconductor equipment modeling method comprising:

in response to an adding instruction operation, determining a type of a source controller configured to display an equipment model object and a type of a target controller configured to display an equipment model tree, wherein the adding instruction operation is used to select a to-be-added model of the equipment model object and a target model of the equipment model tree;

using a verification module corresponding to the type of the source controller and the type of the target controller to obtain information of the selected to-be-added model and information of the selected target model;

performing verification on the information of the to-be-added model and the information of the target model based on a predetermined equipment modeling type verification criterion library to determine whether the to-be-added model is able to be used as a sub-node of the target model in the equipment model tree; and displaying a verification result indicating whether the to-be-added model is able to be used as the sub-node of the target model in the equipment model tree.

2. The method according to claim 1, wherein determining the type of the source controller configured to display the equipment model object and the type of the target controller configured to display the equipment model tree includes:

using a pre-created generic-based function to determine the type of the source controller configured to display the equipment model object and the type of the target controller configured to display the equipment model tree, wherein a formal parameter of the generic-based function includes a formal parameter used to receive a source controller object of the source controller and a formal parameter used to receive a target controller object of the target controller, and when being called, the generic-based function is used to determine the type of the source controller object and the type of the target controller object through reflection to determine the type of the source controller and the type of the target controller.

3. The method according to claim 1, wherein in response to determining that the to-be-added model is able to be used as the sub-node of the target model of the equipment model tree, displaying the verification result indicating whether the to-be-added model is able to be used as the sub-node of the target model of the equipment model tree includes:

displaying the verification result indicating that the to-be-added model is able to be used as the sub-node of the target model of the equipment model tree;

the method further comprising, after displaying the verification result indicating whether the to-be-added model is able to be used as the sub-node of the target model of the equipment model tree:

in response to an adding confirmation operation of a user, adding the to-be-added model to the equipment model tree as the sub-node of the target model.

4. The method according to claim 1, wherein in response to determining that the to-be-added model is able to be used as the sub-node of the target model of the equipment model tree, displaying the verification result indicating whether the to-be-added model is able to be used as the sub-node of the target model of the equipment model tree includes:

displaying the verification result indicating that the to-be-added model is able to be used as the sub-node of the target model of the equipment model tree;

the method further comprising, after displaying the verification result indicating whether the to-be-added model is able to be used as the sub-node of the target model of the equipment model tree:

in response to an adding abandonment operation of a user, abandoning adding the to-be-added model to the equipment model tree.

5. The method according to claim 1, wherein responding to the adding instruction operation includes:

dragging one to-be-added model of the displayed equipment model object to a position of one target model of the displayed equipment model tree responding to the user.

6. The method according to claim 1, wherein the type of the source controller includes one of Tree View type and ListView type, and the type of the target controller includes one of TreeView type and ListView type.

7. The method according to claim 1, wherein the equipment modeling type verification criterion library includes an equipment modeling type verification criterion based on a data collection standard.

8. The method according to claim 7, wherein the data collection standard is a currently adopted version of data collection standard of a plurality of versions of data collection standards.

9. The method according to claim 8, further comprising:

in response to a change of the data collection standard, modifying the equipment modeling type verification criterion based on the data collection standard in the equipment modeling type verification criterion library.

10. A semiconductor equipment modeling device comprising:

a determination circuit configured to, in response to an adding instruction operation, determine a type of a source controller configured to display an equipment model object and a type of a target controller configured to display an equipment model tree, wherein the adding instruction operation is used to select a to-be-added model of the equipment model object and a target model of the equipment model tree;

a verification circuit configured to use a verification module corresponding to the type of the source controller and the type of the target controller to obtain information of the selected to-be-added model and information of the selected target model, and perform verification on the information of the to-be-added model and the information of the target model based on a predetermined equipment modeling type verification criterion library to determine whether the to-be-added model is able to be used as a sub-node of the target model in the equipment model tree; and a feedback circuit configured to display a verification result indicating whether the to-be-added model is able to be used as the sub-node of the target model in the equipment model tree.

* * * * *